(12) United States Patent
Naderyan et al.

(10) Patent No.: US 11,228,845 B2
(45) Date of Patent: Jan. 18, 2022

(54) SYSTEMS AND METHODS FOR ACOUSTIC HOLE OPTIMIZATION

(71) Applicant: Knowles Electronics, LLC, Itasca, IL (US)

(72) Inventors: Vahid Naderyan, Itasca, IL (US); Michael Kuntzman, Chicago, IL (US); Sung Bok Lee, Chicago, IL (US); Wade Conklin, Chicago, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 0 days.

(21) Appl. No.: 16/644,335

(22) PCT Filed: Sep. 14, 2018

(86) PCT No.: PCT/US2018/051194
§ 371 (c)(1),
(2) Date: Mar. 4, 2020

(87) PCT Pub. No.: WO2019/055858
PCT Pub. Date: Mar. 21, 2019

(65) Prior Publication Data
US 2020/0213773 A1    Jul. 2, 2020

Related U.S. Application Data

(60) Provisional application No. 62/559,712, filed on Sep. 18, 2017.

(51) Int. Cl.
*H04R 19/04* (2006.01)
*B81B 7/00* (2006.01)

(52) U.S. Cl.
CPC .......... *H04R 19/04* (2013.01); *B81B 7/0077* (2013.01); *B81B 2201/0257* (2013.01); *B81B 2203/0127* (2013.01); *H04R 2201/003* (2013.01)

(58) Field of Classification Search
CPC .......... B81B 7/0077; B81B 2201/0257; B81B 2203/0127; B81B 2201/0264;
(Continued)

(56) References Cited

U.S. PATENT DOCUMENTS 7,190,038 B2   3/2007   Dehe et al.
7,473,572 B2   1/2009   Dehe et al.
(Continued)

FOREIGN PATENT DOCUMENTS

CN   102164325     8/2011
CN   102984632 A   3/2013
(Continued)

OTHER PUBLICATIONS

Goto et al., "High-Performance Condenser Microphone With Single-Crystalline Silicon Diaphragm and Backplate," IEEE Sensors Journal, vol. 7, No. 1, pp. 4-10 (Jan. 2007).
(Continued)

*Primary Examiner* — Fan S Tsang
*Assistant Examiner* — Julie X Dang
(74) *Attorney, Agent, or Firm* — Foley & Lardner LLP

(57) ABSTRACT

A microphone assembly includes an acoustic transducer having a back plate and a diaphragm, such that a surface of the back plate includes a plurality of holes. At least a portion of the plurality of holes are arranged in a non-uniform pattern. The non-uniform pattern includes holes of varying sizes spaced apart from neighboring holes by varying distances. The microphone assembly further includes an audio signal electrical circuit configured to receive an acoustic signal from the acoustic transducer.

23 Claims, 15 Drawing Sheets

(58) Field of Classification Search
CPC ............... H04R 19/005; H04R 19/04; H04R 2201/003; H04R 19/00; H04R 1/04; H04R 1/06; H01L 2924/1461; H01L 2224/48227; B81C 1/0023; B81C 1103/0154
USPC .................. 381/171–176, 355, 150–151
See application file for complete search history.

(56) References Cited

U.S. PATENT DOCUMENTS

| | | |
|---|---|---|
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 2005/0207605 A1 | 9/2005 | Dehe et al. |
| 2007/0201710 A1* | 8/2007 | Suzuki ............... H04R 31/006 381/174 |
| 2007/0278501 A1 | 12/2007 | MacPherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2008/0304681 A1* | 12/2008 | Langlois ............ B81C 1/00523 381/174 |
| 2009/0001553 A1 | 1/2009 | Pahl et al. |
| 2009/0175477 A1* | 7/2009 | Suzuki ................. H04R 19/04 381/355 |
| 2009/0180655 A1 | 7/2009 | Tien et al. |
| 2009/0202089 A1* | 8/2009 | Zhang .................. H04R 19/04 381/174 |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2016/0112809 A1 | 4/2016 | Zinn et al. |
| 2016/0167946 A1* | 6/2016 | Jenkins ............... H04R 19/04 257/416 |
| 2016/0234592 A1 | 8/2016 | Bolognia et al. |
| 2018/0002161 A1* | 1/2018 | Jenkins ............ B81C 1/00158 |

FOREIGN PATENT DOCUMENTS

| | | |
|---|---|---|
| CN | 103026730 | 4/2013 |
| CN | 105519137 | 4/2016 |
| DE | 10 2006 002 106 B4 | 3/2016 |
| EP | 2 565 153 A1 | 3/2013 |
| JP | 2004-128957 A | 4/2004 |
| JP | 2008-053400 A | 3/2008 |
| JP | 4567643 B2 | 8/2010 |

OTHER PUBLICATIONS

International Search Report and Written Opinion, PCT/US2018/051194, Knowles Electronics, LLC (dated Nov. 30, 2018).

* cited by examiner

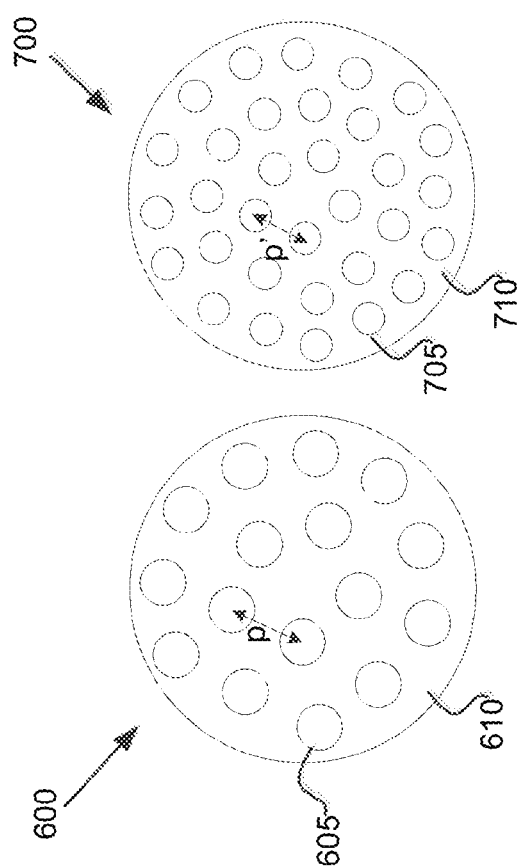

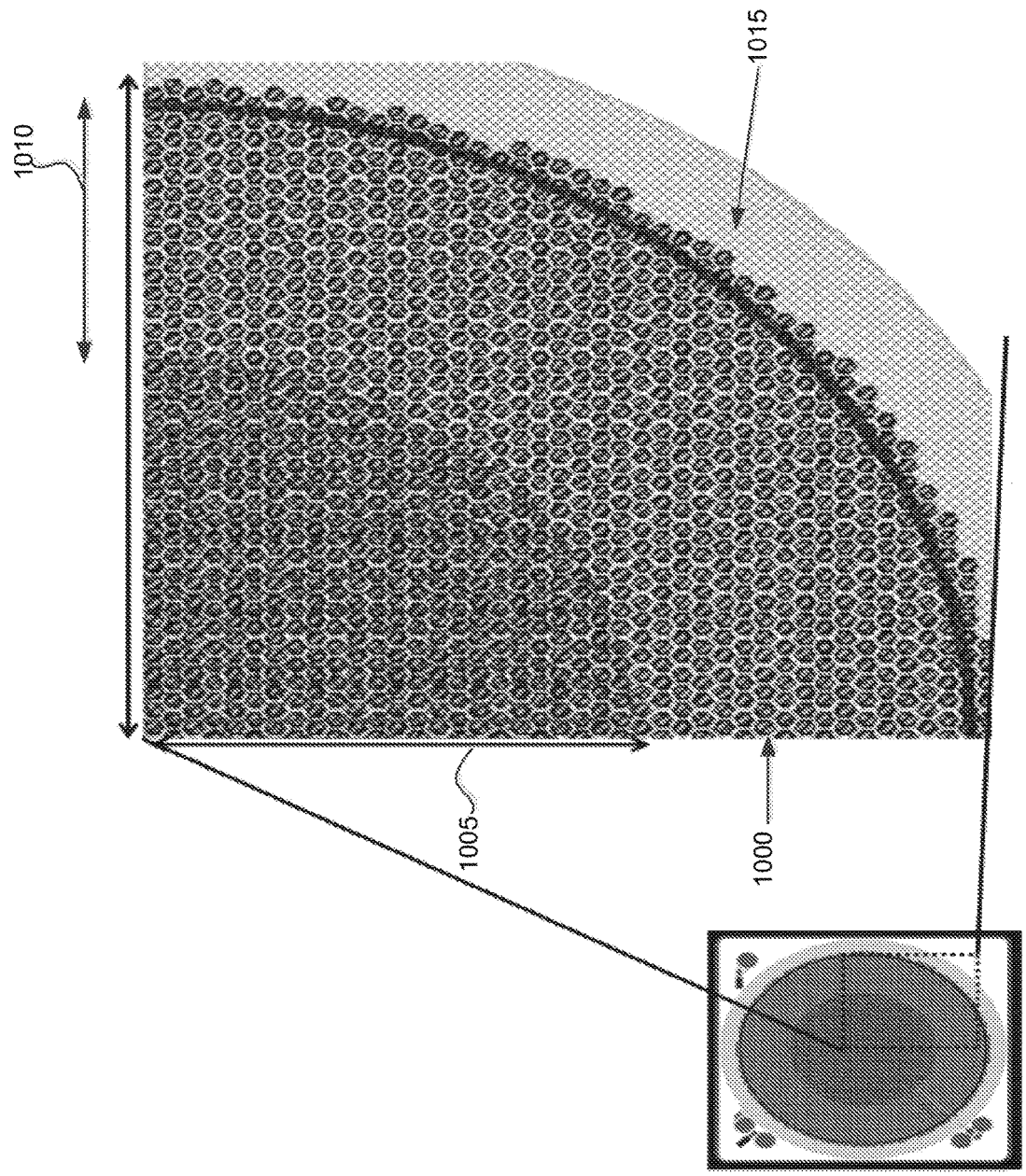

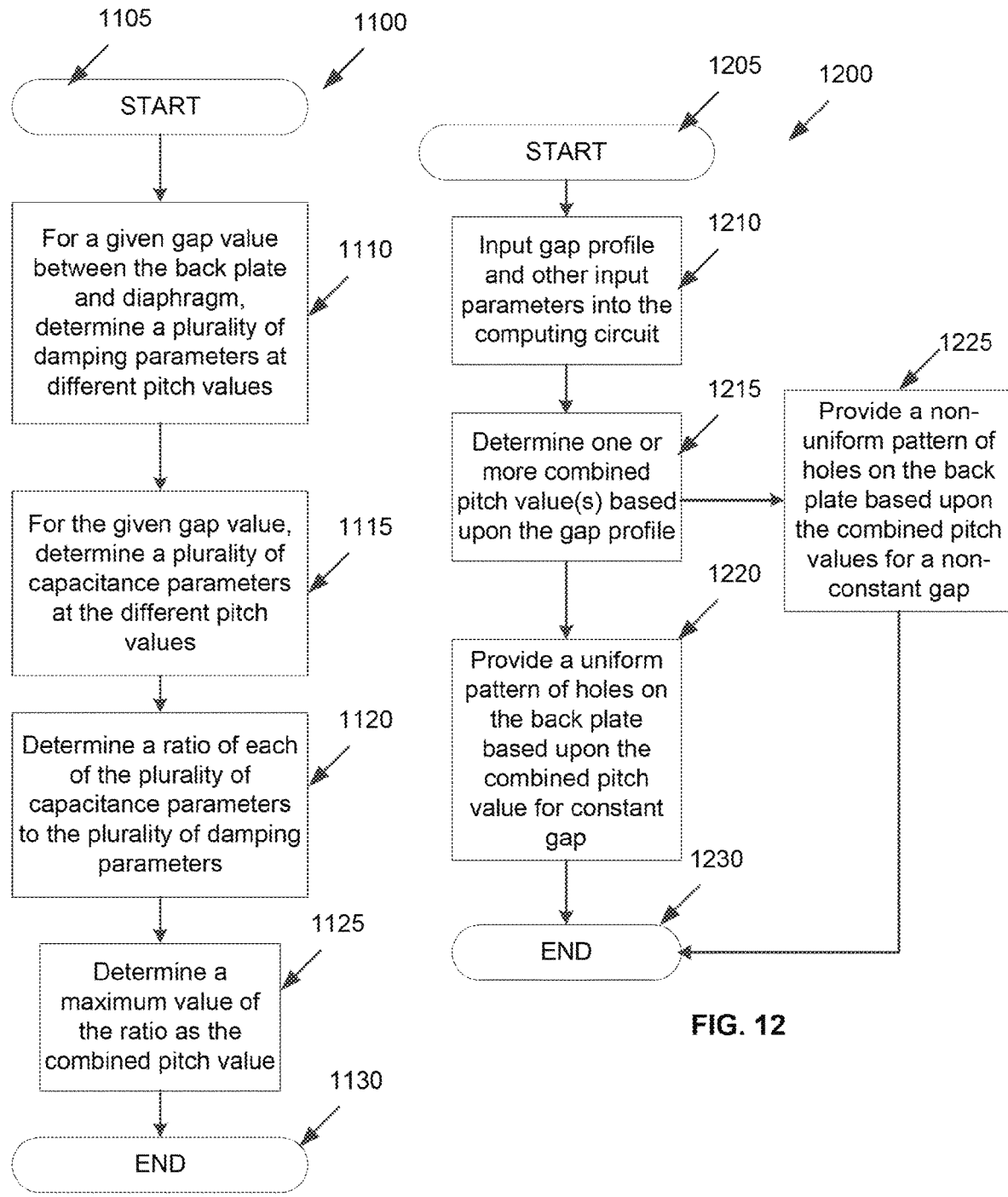

SYSTEMS AND METHODS FOR ACOUSTIC HOLE OPTIMIZATION

CROSS-REFERENCE TO RELATED APPLICATIONS

This application is a National Stage Application of PCT/US2018/051194, filed on Sep. 14, 2018, which claims priority from U.S. Provisional Patent Application No. 62/559,712, filed on Sep. 18, 2017, the entirety of which is incorporated by reference herein.

BACKGROUND

Microphones are widely used in a variety of applications, such as in smartphones, mobile phones, tablets, headsets, hearing aids, sensors, automobiles, etc. It is desirable to increase sound quality in such microphones. Present day microphones have limitations due to their configuration and the way they operate.

BRIEF DESCRIPTION OF THE DRAWINGS

FIG. 6 is an example of the back plate of the acoustic transducer with a uniform pattern of holes.

FIG. 7 is an example of the back plate of the acoustic transducer with another uniform pattern of holes.

FIG. 10 is an example of a pattern of holes within an electrode area of the back plate.

FIG. 11 is a flowchart outlining operations for computing a combined pitch value.

FIG. 12 is a flowchart outlining operations for identifying a uniform or non-uniform pattern of holes on the back plate.

DETAILED DESCRIPTION

Figure 1A:
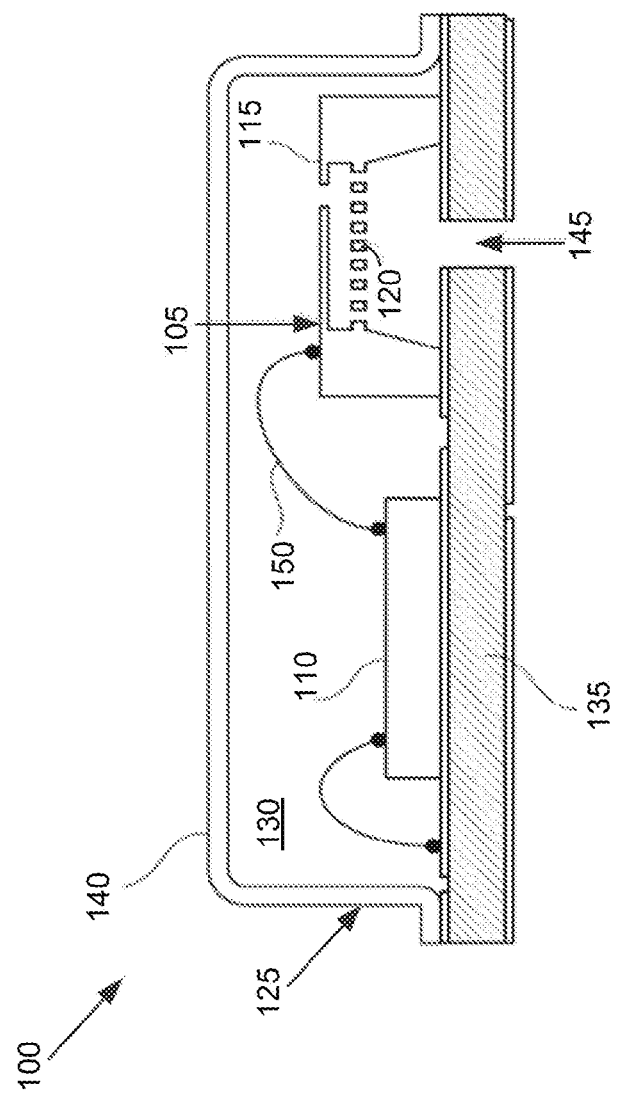
FIG. 1A is a schematic of a bottom port microphone assembly.

The present disclosure relates generally to a system and method for reducing noise (also referred to herein as damping) of an acoustic transducer used within a microphone assembly. Several components of the acoustic transducer contribute towards the noise that is attributed to the acoustic transducer. A back plate of the acoustic transducer is typically the largest contributor of that noise. Noise is generated from the back plate due to the gap between the back plate and a diaphragm of the acoustic transducer, as well as air vertically moving through holes provided on the surface of the back plate. By reducing the noise attributable to the back plate, the noise of the acoustic transducer may be reduced, and the signal-to-noise ratio of the microphone assembly may be increased.

Conventionally, the noise of the back plate has been reduced by increasing a perforation ratio, also called an acoustic hole percentage (AH %). The perforation ratio is the sum of area of each hole on the back plate divided by a total area of the back plate. However, there is a limit to which the perforation ratio may be increased. Factors such as robustness of the back plate and the effective capacitance area limit increasing the perforation ratio beyond a certain value. Thus, the noise of the back plate may be reduced only to a certain extent by increasing the perforation ratio.

The present disclosure provides systems and methods that further reduce the noise due to the back plate by using a combined pitch value. The combined pitch value is used to identify a specific pattern in which holes are arranged on the back plate to reduce noise and increase a signal-to-noise ratio of the acoustic transducer. By using a specific pattern of holes on the back plate, a resistance of air moving vertically through those holes may be reduced, thereby reducing the noise of the back plate. In some embodiments, the combined pitch value is a function of a thickness of the back plate, the perforation ratio, and a gap between the back plate and the diaphragm. For a constant thickness of the back plate and a constant perforation ratio, the gap may be varied, and a combined pitch value may be determined for that gap.

To compute the combined pitch value for a given gap, a plurality of damping parameters and a plurality of capacitance parameters are computed at varying pitches, in some embodiments. A pitch is a distance between the center of one hole on the back plate to the center of a neighboring hole on the back plate. A plurality of ratios are computed for each of the plurality of capacitance parameters and a corresponding one of the plurality of damping parameters. From the computed plurality of ratios, the largest ratio is identified and one or more pitch values corresponding to the largest ratio is determined to be the combined pitch value. Using the combined pitch value, a uniform pattern of holes is identified for the back plate if the gap between the back plate and the diaphragm is constant or substantially constant. On the other hand, if the gap is non-constant or substantially non-constant, a non-uniform pattern is identified, as discussed further below.

FIG. 1A is a microphone assembly 100 having a microelectromechanical system (MEMS) acoustic sensor 105 and a processing circuit 110 that converts acoustic signals (e.g., changes in air pressure) detected by the acoustic sensor into electrical signals. The MEMS acoustic sensor 105 may be implemented as a capacitive or condenser sensor, a piezoelectric sensor, or an optical sensor. In FIG. 1A, the acoustic sensor 105 is a capacitive sensor having a back plate 115 and a diaphragm 120. The microphone assembly 100 also includes a housing 125 defining an enclosed volume 130. The housing 125 includes a base 135 and a cover 140 fastened thereto that encloses and protects the acoustic sensor 105 and the processing circuit 110 disposed therein. An acoustic port 145 in the housing 125 permits the MEMS acoustic sensor 105 to sense changes in air pressure outside the housing. As shown in FIG. 1A, the acoustic port 145 is provided in the base 135. Thus, the microphone assembly 100 is a bottom port microphone assembly. The base 135 may be embodied as a layered material like FR4 with embedded conductors forming a PCB. The cover 140 may be embodied as a metal can, or a layered FR4 material, which may also include embedded conductors. The cover 140 may also be formed from other materials like plastics and ceramics, and the housing generally may include electromagnetic shielding.

In some embodiments, the housing 125 includes external contacts on a surface thereof forming an external device interface, also called a physical interface, for integration with a host device in a reflow or wave soldering operation. In some embodiments, the external device interface includes power, ground, clock, data, and select contacts. The particular contacts constituting the external device interface, however, may depend on the protocol with which data is communicated between the microphone assembly 100 and the host device. Such protocols include, but are not limited to, PDM, SoundWire, I2S, and I2C.

The processing circuit 110 (also referred to herein as an electrical circuit, an audio signal processing circuit, audio signal electrical circuit, or application-specific integrated circuit (ASIC)) is configured to receive the acoustic signal from the MEMS acoustic sensor 105. The MEMS acoustic sensor 105 may be operationally connected to the processing circuit 110 using one or more bond wires 150. In other embodiments, other connecting mechanisms such as vias, traces, electrical connectors, etc. may be used to electronically connect the MEMS acoustic sensor 105 to the processing circuit 110. After processing the acoustic signal, the processing circuit 110 provides the processed acoustic signal at an output or interface of the microphone assembly for use by a computing or host device (e.g., a smartphone, computer, IOT device, hearing device).

Figure 1B:
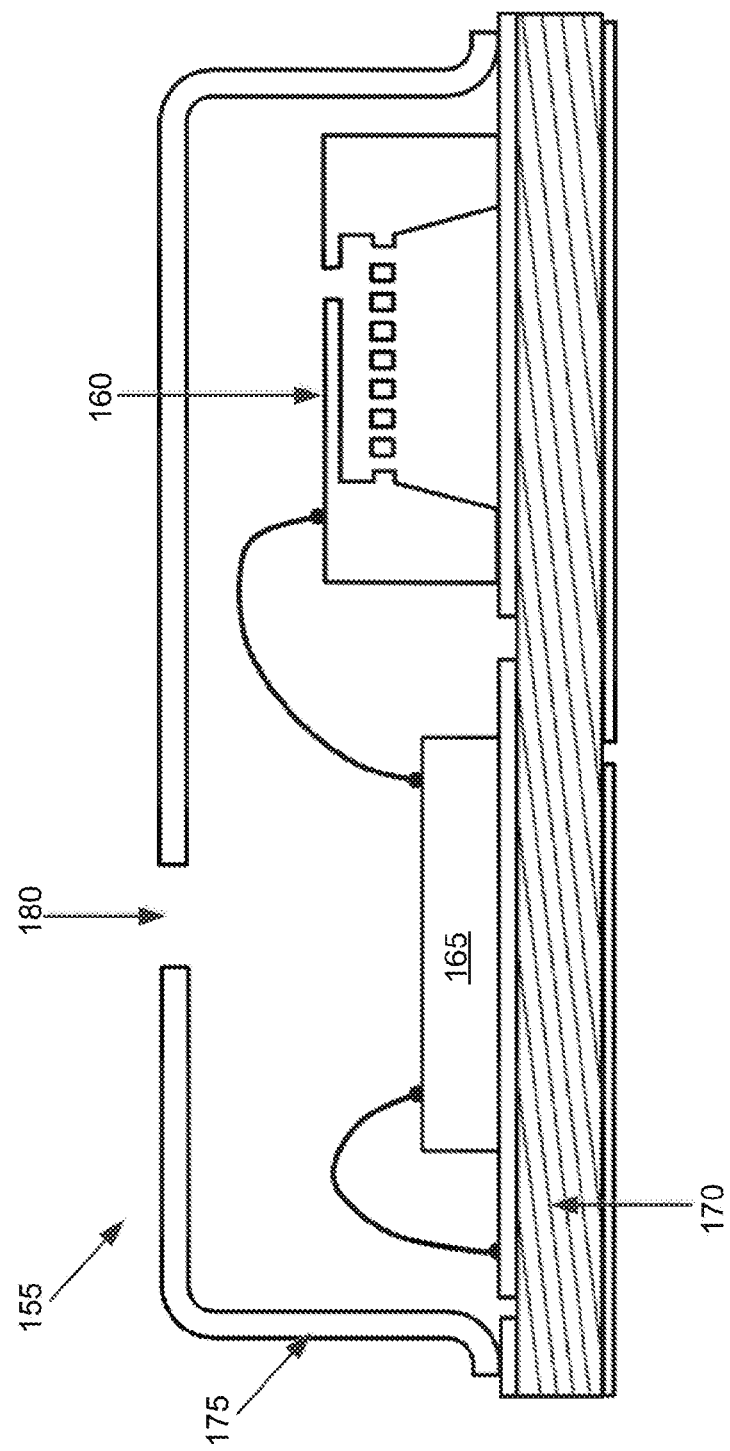
FIG. 1B is a schematic of a top port microphone assembly.

FIG. 1B shows a microphone assembly 155 having a MEMS acoustic sensor 160 and a processing circuit 165 that converts acoustic signals (e.g., changes in air pressure) detected by the acoustic sensor into electrical signals. The microphone assembly 155 also includes a base 170 and a cover 175. Thus, the microphone assembly 155 is somewhat similar to the microphone assembly 100. However, in contrast to the microphone assembly 100 in which the acoustic port 145 is provided in the base 135, acoustic port 180 in the microphone assembly 155 is provided in the cover 175. Thus, the microphone assembly 155 is a top port microphone assembly. The MEMS acoustic sensor 160, the processing circuit 165, the base 170, the cover 175, and the acoustic port 180 of the microphone assembly 155 are configured similar to the MEMS acoustic sensor 105, the processing circuit 110, the base 135, the cover 140, and the acoustic port 145 of the microphone assembly 100, respectively.

Only certain components of the microphone assembly 100 and the microphone assembly 155 are discussed herein. Other components, such as motors, charge pumps, power sources, filters, resistors, etc. that may be used to implement functions described herein and/or other functions of the discussed devices, are not discussed in detail but are contemplated and considered within the scope of the present disclosure. Further, in some embodiments, pressure sensors or other types of sensors that are used in microphone assemblies (e.g., the microphone assembly 100) may be used in lieu of the MEMS acoustic sensor 105 and the MEMS acoustic sensor 160.

Figure 2:
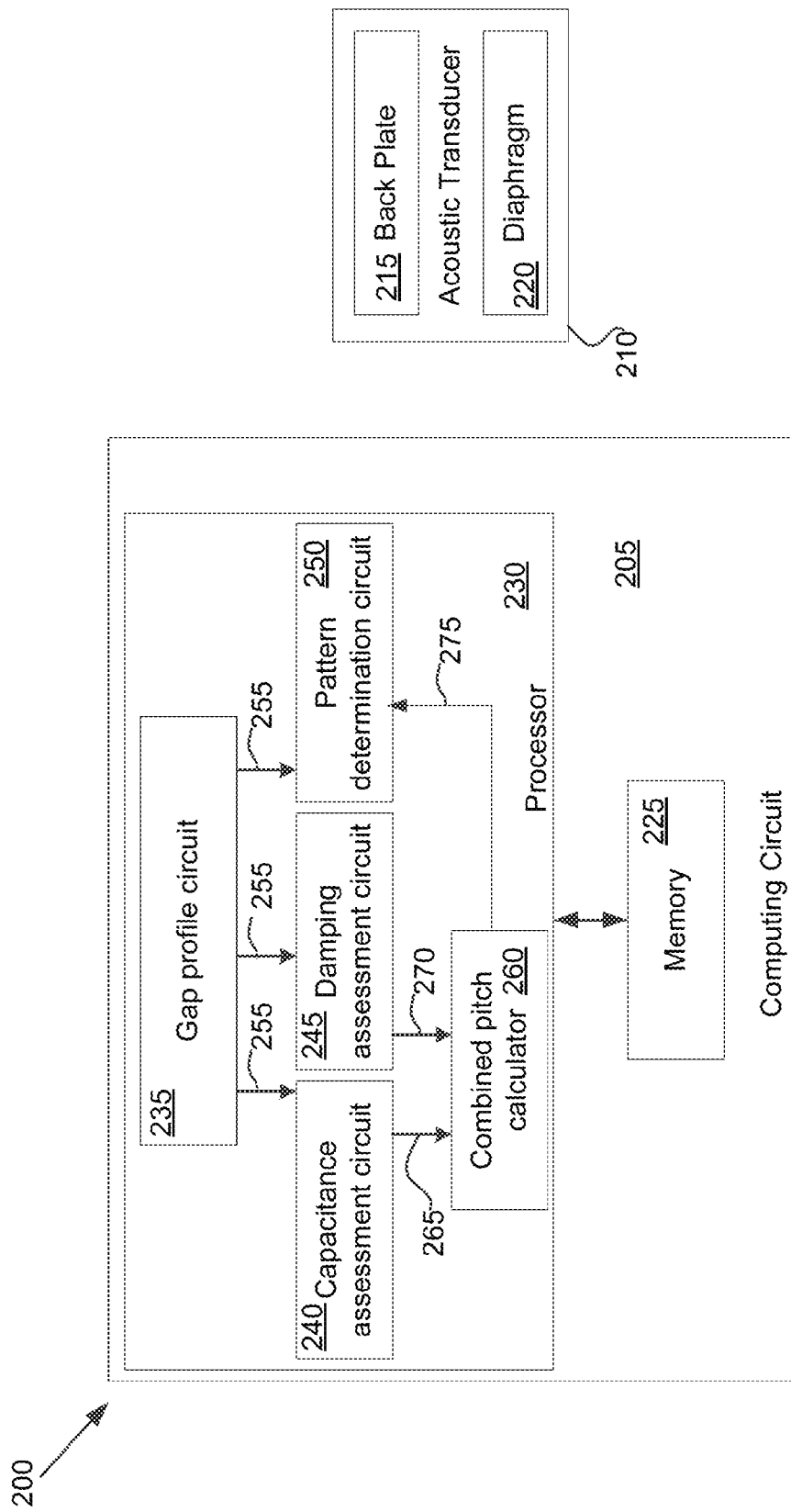
FIG. 2 is a block diagram of a computing circuit that identifies a pattern of holes to be provided on a back plate of the acoustic transducer.

FIG. 2 is a block diagram 200 of a computing circuit 205 that uses data (either actual or simulated) from acoustic transducer 210 to identify a pattern of holes to be provided on the surface of back plate 215 for reducing noise attributable to the back plate. Various parameters may be input into the computing circuit 205 and the computing circuit may identify a pattern of holes for the back plate 215 using those parameters to minimize noise. In some embodiments, a finite element analysis may be used to generate the parameters that are input into the computing circuit 205. In some embodiments, the parameters that are input into the computing circuit 205 may include a thickness of the back plate 215, the AH % (perforation ratio), and a gap profile of the gap between the back plate and diaphragm 220. In some embodiments, parameters such as the number of holes on the back plate 215 may also be input into the computing circuit 205. The computing circuit 205 may be used for any of a variety of types of acoustic transducers, such as dual back plate acoustic transducers.

The computing circuit 205 includes a memory 225 and a processor 230. Although the memory 225 and the processor 230 have been illustrated as being within the computing circuit 205, in some embodiments, one or both of those components may be situated outside of the computing circuit and connected to the computing circuit in operational association. Other components used for performing the functions of the computing circuit 205, as described herein, may also be provided. For example, in some embodiments, a separate controller for controlling flow of data (e.g., priority of data on a data bus) between components and the processor 230 may be provided.

The processor 230 includes a gap profile circuit 235 that stores the gap profile between the back plate 215 and the diaphragm 220 that is input into the computing circuit 205. The gap profile may include one or more gap values between the back plate 215 and the diaphragm 220 and may be indicative of whether the gap is constant (or substantially constant) or non-constant (or substantially non-constant). Thus, the gap profile may vary based upon the "deflection" of the diaphragm 220. Generally speaking, when the acoustic transducer 210 is biased with a voltage (e.g., a direct current voltage), an electric field is induced between the back plate 215 and the diaphragm 220. The electric field applies an electrostatic force which bows the diaphragm 220 towards or away from the back plate 215, thereby causing a deflection of the diaphragm. The deflection of the diaphragm 220 may vary based upon the type of diaphragm. For example, a free-plate diaphragm design may experience greater deflection than a clamped diaphragm design. In some embodiments and depending upon the type of the diaphragm 220 that is used in the acoustic transducer 210, if the maximum deflection of the diaphragm is less than or equal to about 0.2 microns, the diaphragm may be said to be a "flat" diaphragm and the gap profile may be said to be constant or substantially constant. On the other hand, if the maximum deflection of the diaphragm 220 is larger than 0.2 microns, then the diaphragm may be said to be "deflected" and the gap profile may be said to be non-constant or substantially non-constant. As noted above, the gap profile may also identify a value of the gap between the back plate 215 and the diaphragm 220 and the value of the gap may be stored within the gap profile circuit 235.

Furthermore, if the gap profile indicates a constant (or substantially constant) gap profile, a single gap value may be input into the computing circuit 205 and stored into the gap profile circuit 235. However, for a non-constant (or substantially non-constant) gap, multiple gap values (e.g., average gap values as discussed below) may be provided with each gap value corresponding to a particular position in between the back plate 215 and the diaphragm 220. For example, in some embodiments, the gap profile may identify a gap value at several pre-determined measurement points between the back plate 215 and the diaphragm 220. In some embodiments, the gap between the back plate 215 and the diaphragm 220 may be measured in micro meters, although other units may be used as well.

In addition to storing the gap profile data, the gap profile circuit 235 may provide the gap profile data to a capacitance assessment circuit 240, a damping assessment circuit 245, and a pattern determination circuit 250, as indicated by communication link 255.

The capacitance assessment circuit 240 determines a capacitance parameter for each gap value that is received from the gap profile circuit 235. The capacitance parameter reflects the capacitance between the back plate 215 and the diaphragm 220 at the gap value. In some embodiments, the capacitance assessment circuit 240 computes or determines a plurality of the capacitance parameters for each gap value. Each of the plurality of capacitance parameters may correspond to a particular value of pitch of the back plate 215. Pitch, as used herein, means a distance between the centers of two neighboring holes on the back plate 215. Varying the pitch of the back plate 215 varies the capacitance between the back plate and the diaphragm 220. Thus, a plurality of the capacitance parameters may be computed or determined at each gap value by using a different value of the pitch for each capacitance parameter.

Figure 3A:
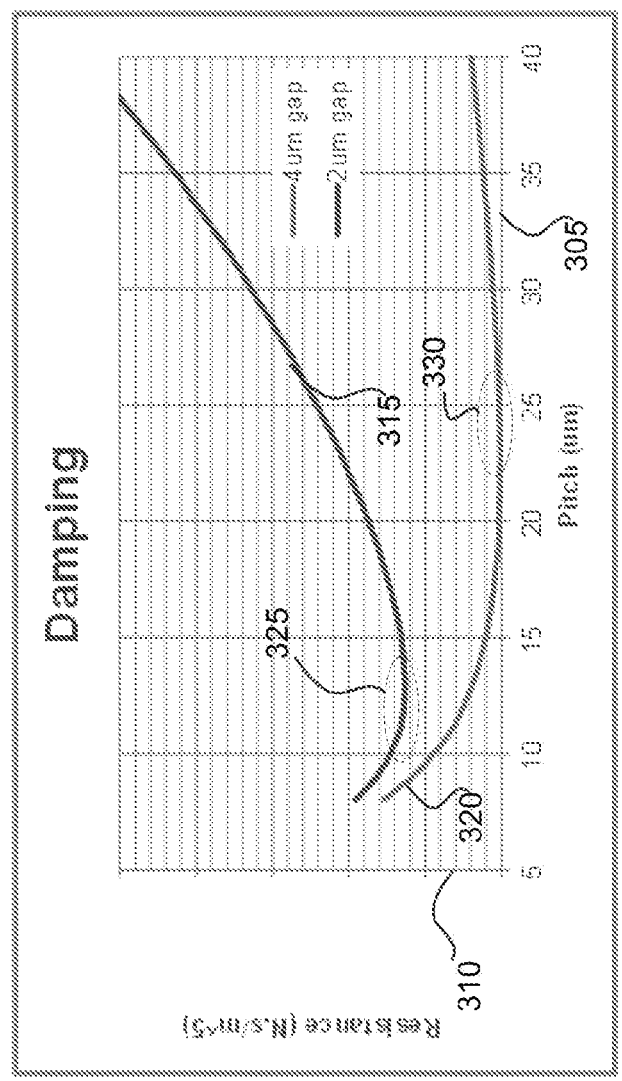
FIG. 3A is a graph showing variations in a damping parameter of the acoustic transducer with varying pitch.
Figure 3B:
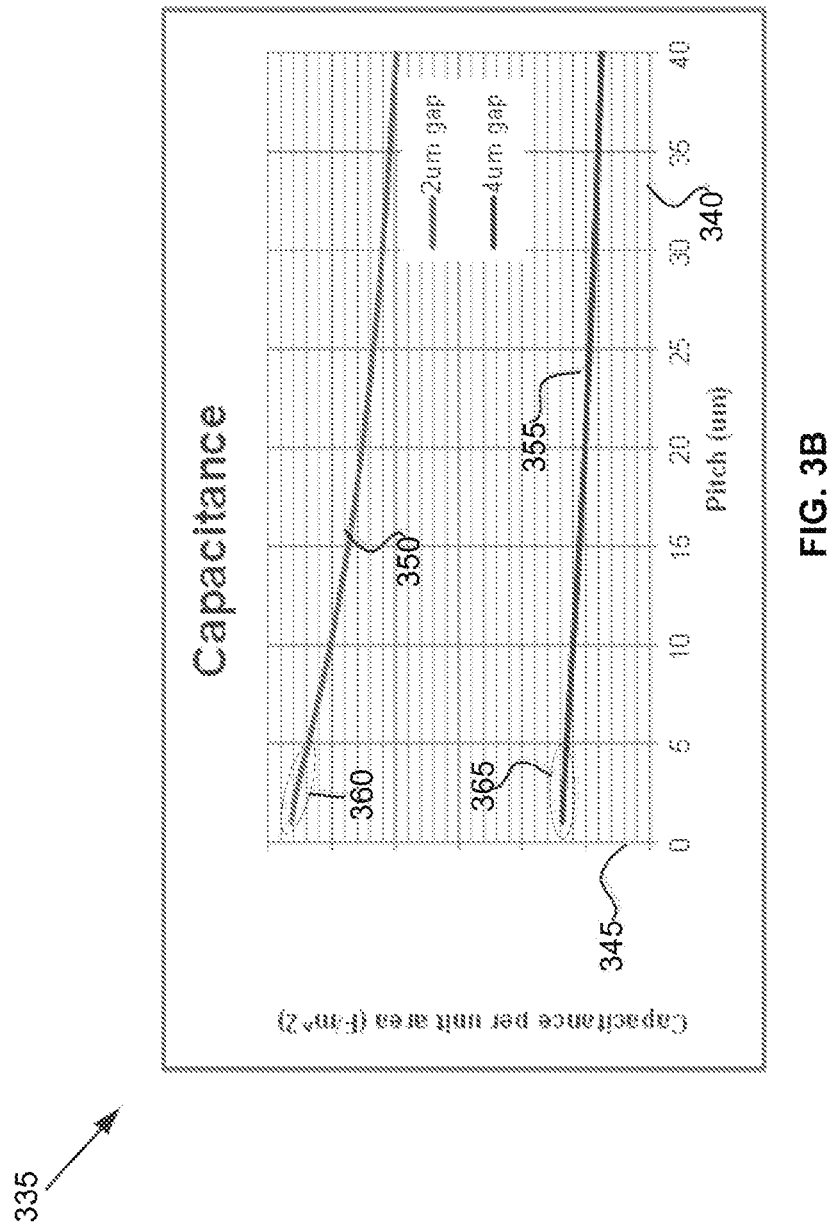
FIG. 3B is a graph showing variations in a capacitance parameter of the acoustic transducer with varying pitch.

In some embodiments, the capacitance parameters may be determined from a look-up table stored within the computing circuit 205 such that for a given gap value and pitch value, the look-up table may include a corresponding capacitance parameter for that gap value and pitch value. In other embodiments, other mechanisms or simulations may be used by the computing circuit to compute each of the plurality of capacitance parameters. Variation in the capacitance parameters with the pitch is shown in FIG. 3B below. The capacitance assessment circuit 240 inputs the plurality of the capacitance parameters into a combined pitch calculator 260 via communication link 265.

The damping assessment circuit 245 calculates a damping parameter of the back plate 215. The damping parameter reflects the total noise that is attributable to the back plate 215 at a given gap value. Similar to the capacitance parameter, the damping parameter also varies with the pitch of the back plate 215. Thus, for each gap value, a plurality of damping parameters are computed by the computing circuit 205 by varying the pitch. In general, the same values of the pitch that are used for computing the capacitance parameters are also used for computing the damping parameters, in some implementations. Therefore, for each gap value, a plurality of capacitance parameters and a plurality of damping parameters are determined, with each of the plurality of capacitance parameters at a specific pitch having a corresponding one of the plurality of damping parameters at that specific pitch.

Each of the plurality of damping parameters may be computed by the damping assessment circuit 245. In some embodiments, the damping assessment circuit 245 may implement the following formula, which is derived from Dorel Homentcovschi and Ronald N. Miles: "Viscous Microstructural Dampers with Aligned Holes: Design Procedure Including the Edge Correction," published in J. Acoust. Soc. Am. 122, September 2007, pages 1556-1567:

$$C = N \frac{12\pi\mu r_1^4}{g_0^3} K(\beta) + N \frac{8\pi\mu h r_1^4}{r_0^4}$$

where C is the total noise or damping attributable to the back plate 215. The first term of the formula (e.g., the term between the "=" and the "+" signs) computes damping introduced by the gap between the back plate 215 and the diaphragm 220, and the second term of the formula (e.g., the term after the "+" sign) computes damping introduced by air moving vertically through the holes of the back plate (also referred to as the resistance of the holes). Thus, the total damping of the back plate 215 includes two components: a first damping component attributable to the gap value and a second damping component attributable to the pitch.

In the formula above:
N is the number of holes on the back plate
$\mu$ is the viscosity of air
$g_0$ is the gap between the back plate 215 and the diaphragm 220
K is a function of the area perforation ratio ($\beta$)
h is the thickness of the back plate
$r_1$ is the radius of a circular cell surrounding a hole on the back plate; and
$r_0$ is the radius of a hole on the back plate.

Additionally, in the formula above, the perforation ratio (AH %) and the thickness of the back plate 215 are assumed to be constant and are input into the computing circuit 205. Further, the combination of the $r_1$ and $r_0$ correspond to the pitch of the back plate 215. The only parameters that are changing in the formula above are the gap value and the pitch of the back plate 215. Therefore, for each gap value, the pitch may be varied to vary the total damping, C, of the back plate 215 in the formula above to obtain the plurality of damping parameters. Each computed value of C corresponds to one damping parameter. Variations in the damping parameter with the pitch are illustrated in FIG. 3A below. The damping assessment circuit 245 provides the plurality of damping parameters to the combined pitch calculator 260 via communication link 270. It is to be understood that the above formula is only an example for computing the plurality of damping parameters. In other embodiments, the damping assessment circuit 245 may implement other formulae or mechanisms to compute the plurality of damping parameters.

Figure 4:
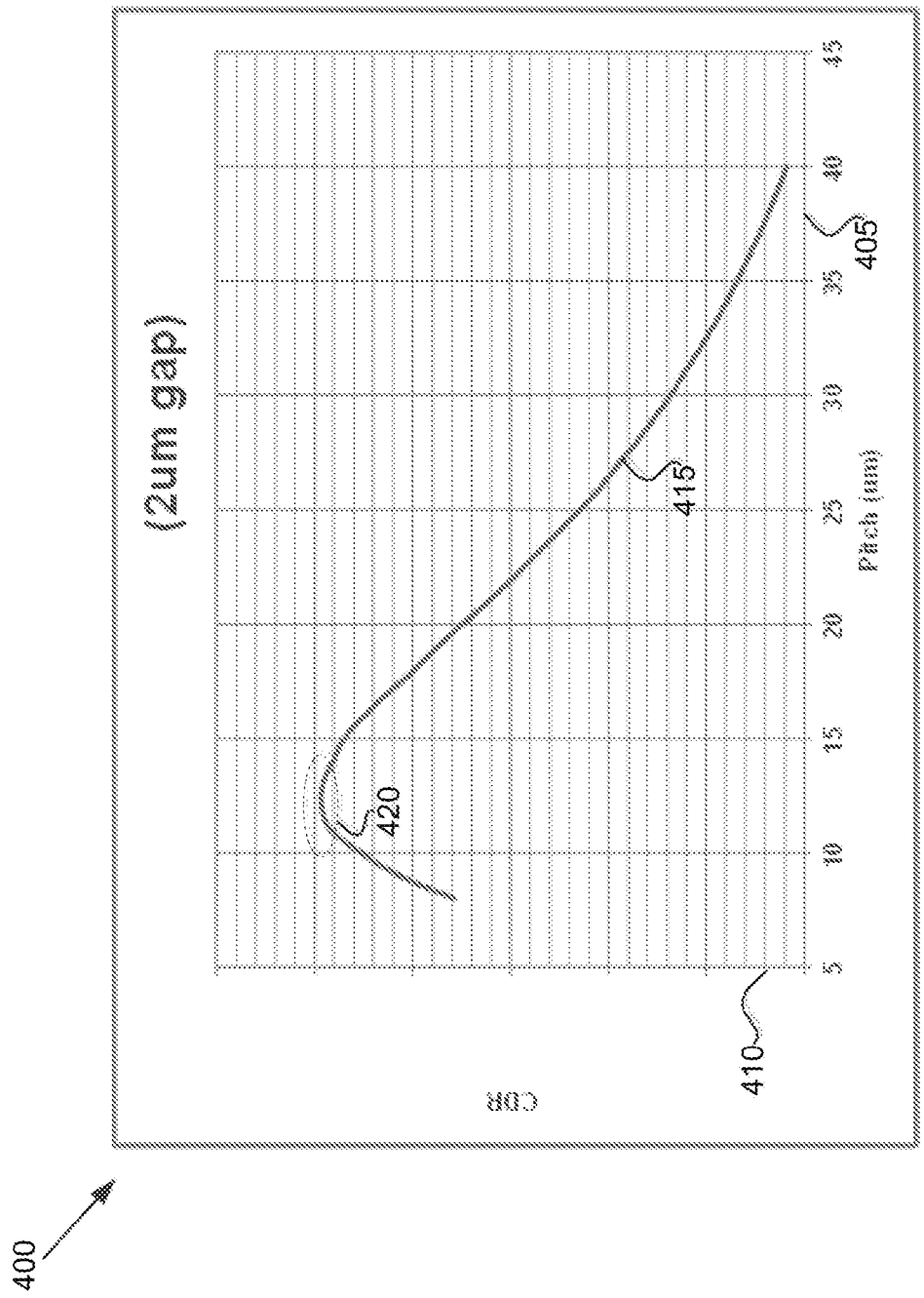
FIG. 4 is a graph showing variations in a ratio of the capacitance parameter and the damping parameter with varying pitch at a first gap between the back plate and the diaphragm of the acoustic transducer.
Figure 5:
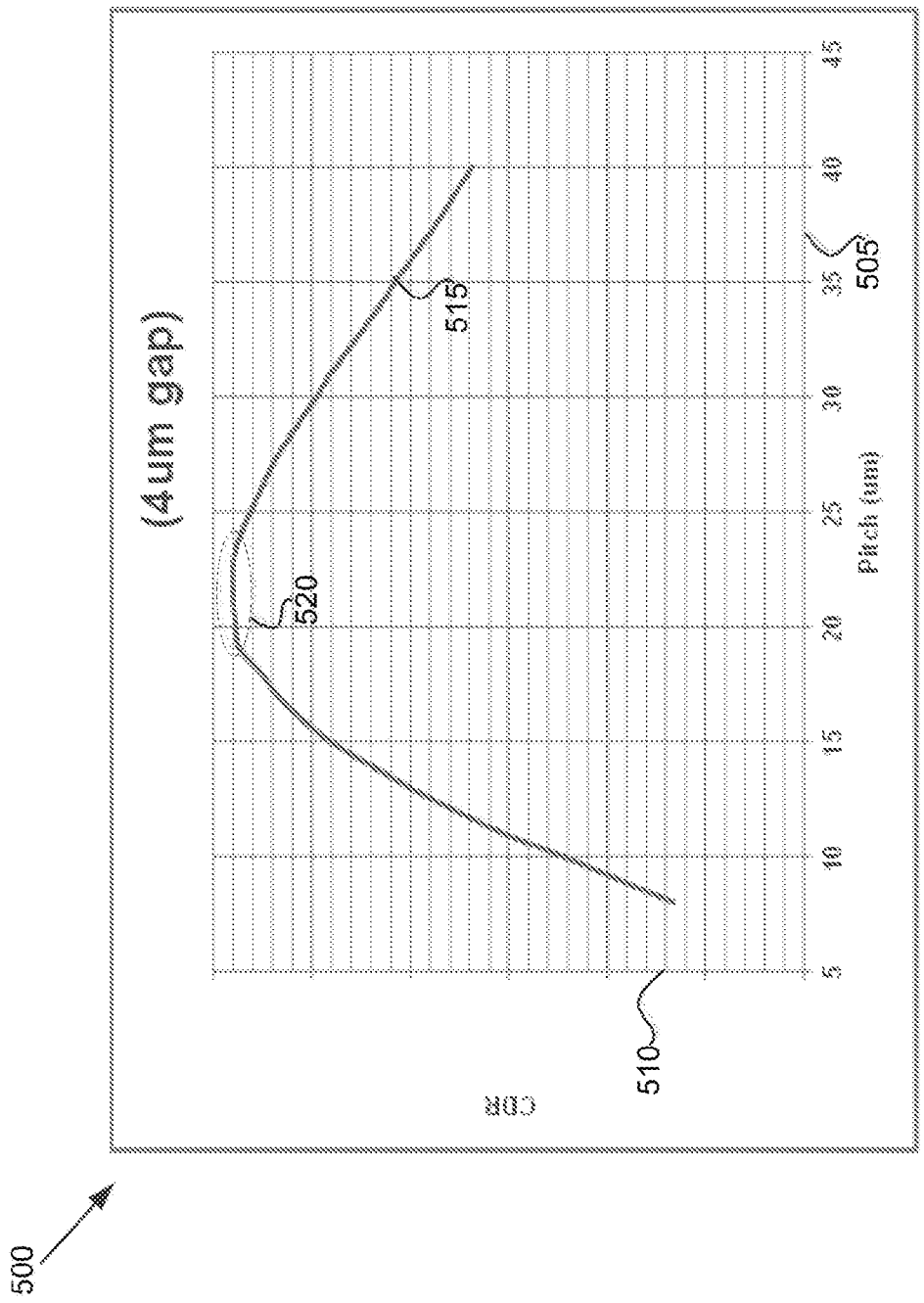
FIG. 5 is another graph showing variations in the ratio of the capacitance parameter and the damping parameter with varying pitch at a second gap between the back plate and the diaphragm of the acoustic transducer.

The combined pitch calculator 260 receives the plurality of capacitance parameters from the capacitance assessment circuit 240 and the plurality of damping parameters from the damping assessment circuit 245. Using those parameters, the combined pitch calculator 260 computes a combined pitch value. Specifically, for each pitch value used in computing the plurality of capacitance parameters and the plurality of damping parameters, the combined pitch calculator 260 computes a ratio of each of the plurality of capacitance parameters and the corresponding one of the plurality of damping parameters. The combined pitch calculator 260 then identifies the largest ratio from all of the calculated ratios. One or more pitch values corresponding to the largest ratio may be selected to be the combined pitch value. FIGS. 4 and 5 below illustrate the combined pitch value on a graph. Using the combined pitch value, an optimized pattern of holes on the back plate 215 may be identified.

The combined pitch calculator 260 provides the combined pitch value to the pattern determination circuit 250 via communication link 275. The pattern determination circuit 250 thus receives the gap profile from the gap profile circuit 235 and the combined pitch value from the combined pitch calculator 260. If the gap profile indicates a non-constant (or substantially non-constant) gap, the pattern determination circuit 250 identifies a non-uniform pattern of holes to be provided on the back plate 215 based upon multiple combined pitch values. If the gap profile indicates a constant (or substantially constant) gap, the pattern determination circuit 250 identifies a uniform pattern of holes to be provided on the back plate 215, based upon a single combined pitch value. Uniform and non-uniform patterns of holes are discussed below.

While various components of the system are described above and illustrated in FIG. 2 as being implemented as part of the processor 230, it is to be understood that such components may be implemented using hardware, software, or any combination thereof in various example implementations. For example, the gap profile circuit 235, the capacitance assessment circuit 240, the damping assessment circuit 245, the pattern determination circuit 250, the combined pitch calculator 260, and/or various other components of the computing circuit 205 may be implemented using specialized hardware (e.g., application-specific integrated circuits (ASICs) that form part or all of the processor 230 or another part of the computing circuit 205), instructions stored in the memory 225 and executable by the processor to implement the functions of the computing circuit, or a combination thereof.

FIG. 3A is a graph 300 illustrating variations in the plurality of damping parameters at varying pitches at a constant AH % and a constant thickness of the back plate 215. The graph 300 plots pitch on an X-axis 305 against resistance of the holes on the back plate 215 on a Y-axis 310. The resistance on the Y-axis 310 provides an indication of the total damping of the back plate 215 for a given gap value. Typically the lower the resistance, the lower the total damping. Minimizing total damping is desirable.

The graph 300 shows a first plot 315 representative of a first gap value of two micrometers and a second plot 320 representative of a second gap value of four micrometers. It is to be understood that the first plot 315 and the second plot 320 are only examples. Similar plots may be plotted for different gap values as well. Each of the first plot 315 and the second plot 320 is obtained by plotting the plurality of damping parameters for the gap value representative of that plot at varying pitches. From the graph 300, it is seen that as the pitch increases along the X-axis 305, the resistance along the Y-axis 310 decreases before increasing again. Range 325 represents the lowest resistance points of the first plot 315 and range 330 represents the lowest resistance points of the second plot 320. Thus, at the ranges 325 and 330, the total damping for the given gap value is minimized. The pitches corresponding to the ranges 325 and 330 represent the optimum damping pitch and thus provide pitch values at which damping is minimized.

Thus, if the goal is to minimize damping of the back plate 215, the optimum damping pitch for a particular gap value may be used in identifying an optimum pattern of holes on the back plate 215 to minimize the damping associated with the back plate.

From the graph 300, it is also seen that as the gap value increases, the optimum damping pitch also increases. For example, the optimum damping pitch at the range 330 of the second plot 320, which corresponds to a bigger gap value, is larger than the optimum damping pitch at the range 325 of the first plot 315, which corresponds to a smaller gap value compared to the second plot. Thus, the higher the gap value between the back plate 215 and the diaphragm 220, the higher is the optimum damping pitch.

FIG. 3B is a graph 335 that plots pitch on X-axis 340 against capacitance on Y-axis 345 at a constant AH % and a constant thickness of the back plate 215. The X-axis 340 is the same as the X-axis 305 of FIG. 3A. The capacitance on the Y-axis 345 is representative of the capacitance parameter. Similar to the graph 300, the graph 335 includes a first plot 350 representative of the first gap value of two micrometers and a second plot 355 representative of the second gap value of four micrometers. Thus, the first plot 350 of FIG. 3B represents the plurality of capacitance parameters and the first plot 315 of FIG. 3A represents the plurality of damping parameters for the same gap value and the same pitches. Likewise, the second plot 355 of FIG. 3B represents the plurality of capacitance parameters and the second plot 320 of FIG. 3A represents the plurality of damping parameters for the same gap value and the same pitches.

From the graph 335, it is seen that as the pitch on the X-axis 340 increases, the capacitance decreases. Thus, higher pitch corresponds to lower capacitance. Typically, it is desirable to increase capacitance. Thus, a range 360 on the first plot 350 and range 365 on the second plot 355 represent the highest capacitance on the graph 335. The pitches corresponding to the ranges 360 and 365 are desirable or optimum capacitance pitches for those gap values. If the goal is to maximize capacitance of the back plate, one or more pitches corresponding to the optimum capacitance pitches may be used to identify a pattern of holes on the back plate 215.

Figure 3C:
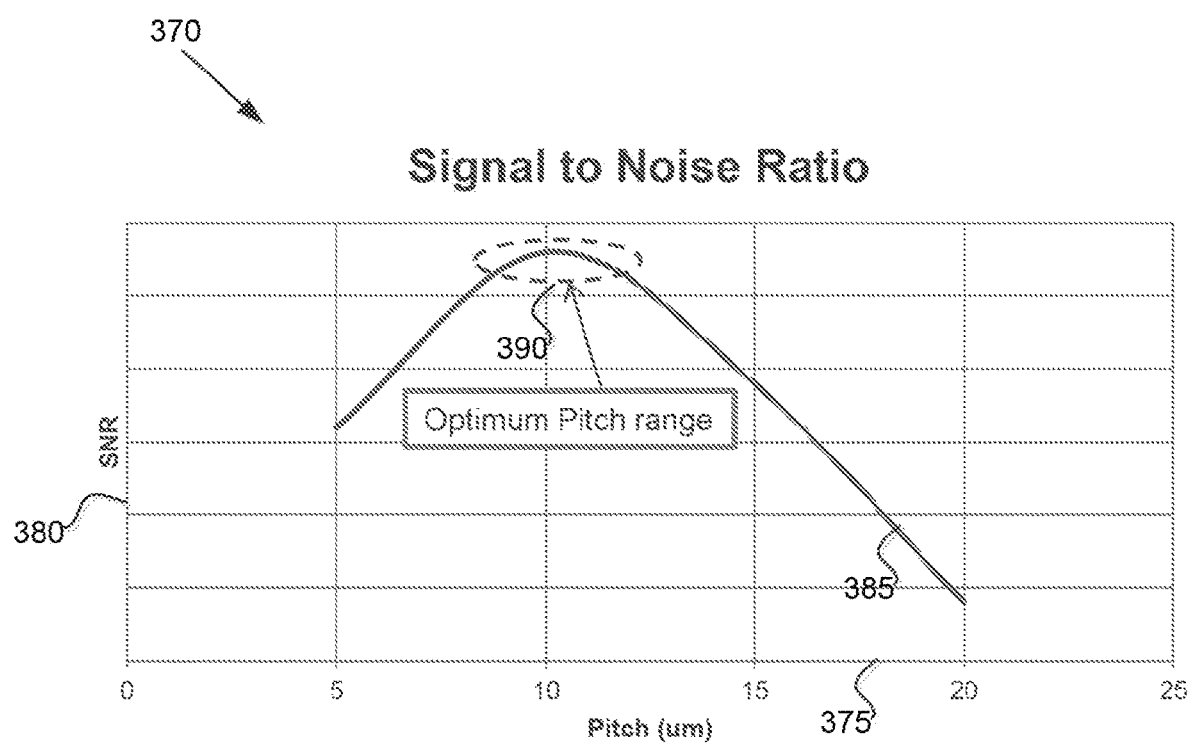
FIG. 3C is a graph showing variations in a signal-to-noise ratio of the acoustic transducer with varying pitch.

FIG. 3C is a graph 370 that plots pitch on X-axis 375 against signal-to-noise ratio ("SNR") on Y-axis 380 at a constant AH % and a constant thickness of the back plate 215. The X-axis 375 is the same as the X-axis 305 of FIG. 3A and the X-axis 340 of FIG. 3B. The SNR on the Y-axis 380 is representative of the SNR of the back plate 215. The graph 370 includes a plot 385 representing variations in the SNR with varying pitches. For example, the graph 370 shows that as the pitch increases on the X-axis 375, the SNR increases before decreasing. Generally speaking, a higher SNR is desirable. Thus, one or more pitch values corresponding to range 390, where the SNR is the maximum, may be used to obtain an optimized pattern of holes on the back plate 215. Therefore, if the goal is to maximize SNR, the range 390 may be used.

Although it is desirable to reduce damping and increase capacitance, the damping pitch range at which the total damping is minimized is different from the capacitance pitch range at which the capacitance is maximized. If the minimized damping pitch range is used to determine the pattern of holes on the back plate 215, the capacitance between the back plate and the diaphragm 220 is adversely impacted. Likewise, if the maximized capacitance pitch range is used to determine the pattern of holes on the back plate 215, the total damping is adversely impacted. Thus, if the goal is to achieve a balance between total damping and capacitance, a pitch value or pitch range may be chosen such that a trade-off between the damping and the capacitance is made and neither the total damping nor the capacitance is severely adversely impacted.

The trade-off between damping and capacitance is obtained by computing a ratio of each of the plurality of capacitance parameters and the corresponding one of the plurality of damping parameters for a given gap value, and identifying a combined pitch value or range that achieves the trade-off between capacitance and damping. Therefore, for each gap value, a plurality of capacitance-to-damping parameter ratios may be computed. The largest of those ratios may then be determined to identify the combined pitch value discussed above.

FIG. 4 shows a graph 400 that plots pitch on X-axis 405 against capacitance-to-damping parameter ratios on Y-axis 410 for the first gap value of two micrometers at a constant AH % and a constant thickness of the back plate 215. The X-axis 405 has the same pitches as the X-axis 305 and the X-axis 340. The graph 400 also shows a plot 415, which indicates how the capacitance-to-damping parameter ratios vary with increasing the pitch. As seen from the graph 400, as the pitch increases along the X-axis 405, the capacitance-to-damping parameter ratios increase to a maximum range 420 before decreasing. One or more of the pitches on the X-axis 405 corresponding to the maximum range 420 may be used as the combined pitch value. For example, in some embodiments, the maximum range 420 may include a ten percent variation from the largest pitch value on the X-axis 405. In other words, the combined pitch value that is selected may be within ten percent of the largest pitch value on the X-axis 405. In other embodiments, other percentages may be used for the maximum range 420. This combined pitch value is used to identify a pattern of holes on the back plate 215 by the pattern determination circuit 250, as further discussed below.

FIG. 5 shows another graph 500 that plots pitch on X-axis 505 against capacitance-to-damping parameter ratios on Y-axis 510 at a constant AH % and a constant thickness of the back plate 215. The graph 500 is analogous to the graph 400, except that the graph 500 includes a plot 515 for the second gap value of four micrometers. From the graph 500 it is seen that as the pitch increases along the X-axis 505, similar to the plot 415 of FIG. 6, the capacitance-to-damping parameter ratio increases to a maximum range 520 before decreasing. One or more pitch values on the X-axis 505 corresponding to the maximum range 520 identifies a combined pitch value that represents the trade-off between the damping pitch and the capacitance pitch at which the overall noise or damping attributable to the back plate 215 is reduced without severely impacting the capacitance. Similar to the maximum range 420, the maximum range 520 may include pitch values that are up to ten percent greater or ten percent lower than the maximum pitch value. In other embodiments, other percentages may be used for the maximum range 520. Comparing the combined pitch value (e.g., the pitch value(s) on the X-axis 405, 505 corresponding to the maximum range 420, 520, respectively) from the graph 400 with the combined pitch value from the graph 500, it is seen that the combined pitch value of the graph 500 (having the higher gap value) is higher than the combined pitch value of the graph 400 (which has a lower gap value). Thus, as the gap value increases, the combined pitch value also increases. In other words, the combined pitch value is a function of (e.g., directly proportional to) the value of the gap between the back plate 215 and the diaphragm 220.

In some embodiments, the combined pitch value may vary between 6 microns to 37 microns (also known as micrometers) based upon the gap between the back plate 215 and the diaphragm 220, the thickness of the back plate, and the AH %. In some embodiments, the gap between the back plate 215 and the diaphragm 220 may vary from 0.5 micrometers to 10 micrometers. Further, in some embodiments, the thickness of the back plate 215 may vary from 0.1 micrometers to 6 micrometers, while the AH % may vary, in some embodiments, from 25% to 80%. For example, in some embodiments, for a gap of 4 micrometers, a thickness of the back plate 215 of 2 micrometers, and an AH % of 50%, the combined pitch value may be in a range of 20-24 micrometers. Similarly, for a gap of 2 micrometers, a thickness of the back plate 215 of 1 micrometer, and the AH % of 30%, the combined pitch value may be within a range of 9-13 micrometers. Likewise, for a gap of 5 micrometers, a thickness of the back plate 215 of 3 micrometers, and the AH % of 70%, the combined pitch value may be within a range of 33-37 micrometers.

Additionally, in some embodiments, if the gap and the thickness of the back plate 215 are kept substantially constant and the AH % is varied, the combined pitch value may vary. For example, for a gap value of 2.75 micrometers and a thickness of the back plate of 1.9 micrometers, example combined pitch values (referred to in the table below as the optimized pitch) at varying AH % (referred to as AHP[%]) in the table below are shown in the table below:

| AHP [%] | Optimized Pitch [μm] |
| --- | --- |
| 30 | 16.99 |
| 40 | 15.98 |
| 50 | 15.46 |
| 60 | 15.38 |
| 70 | 15.82 |

Similarly, for a gap value of 6 micrometers and a thickness of the back plate of 1.9 micrometers, example combined pitch values (referred to in the table below as the optimized pitch) at varying AH % (referred to as AHP[%]) in the table below are shown in the table below:

| AHP [%] | Optimized Pitch [μm] |
| --- | --- |
| 30 | 28.84 |
| 40 | 27.46 |
| 50 | 26.70 |
| 60 | 27.24 |
| 70 | 28.33 |

Thus, the combined pitch value varies based upon a gap value between the back plate 215 and the diaphragm 220, the thickness of the back plate, and the AH %.

FIG. 6 is an example of a back plate 600 having a uniform pattern of holes 605 on a surface 610 thereof. The back plate 600 is configured with a constant thickness and a constant perforation ratio. In some implementations, "uniform" means that the holes 605 are the same or substantially same sized (e.g., not varying in size from another hole by more than 10%) and evenly or substantially evenly spaced on the surface 610 of the back plate 600. In other words, in a "uniform" pattern, the holes 605 are spaced at the same combined pitch value, p, meaning that the distance from the center of one of the holes to the center of a neighboring one of the holes is the same (or substantially same) for every neighboring pair of the holes on the surface 610 of the back plate 600. However, in some implementations, the holes 605 may be evenly or substantially evenly spaced but may differ in size, or the holes 605 may be the same or substantially the same size but the spacing between the holes may differ, and all such implementations are contemplated within the scope of the present disclosure.

At a fixed perforation ratio, the size of the holes 605 and the distance between two neighboring ones of those holes is a function of the combined pitch value. As the combined pitch value increases, the size of each of the holes 605 increases, and the total number of the holes on the surface 610 of the back plate 600 decreases. Further, the holes 605 on the back plate 600 may be arranged in a geometrical or a random pattern so long as the holes are spaced at the same or substantially same combined pitch value.

FIG. 7 is an example of a back plate 700 having another uniform pattern of holes 705 on a surface 710 thereof. The back plate 700 is analogous to the back plate 600 to the extent that the back plate 700 also has the same constant thickness and the same constant perforation ratio of the back plate 600. The holes 705 on the back plate 700 are equally (or substantially equally) sized and evenly or substantially evenly spaced on the surface 710. Thus, any two neighboring holes (e.g., the holes 705) on the back plate 700 have the same or substantially same combined pitch value, p'.

Comparing the back plate 600 with the back plate 700, it can be seen that the back plate 600 has a fewer number of the holes 605 relative to the number of the holes 705 on the back plate 700, even though both the back plates have a uniform pattern of holes. The difference in the number of the holes is due to the different combined pitch values, p and p'. Just as the size of the holes (e.g., the holes 605, 705) increases with increasing combined pitch value, the size of those holes decreases with decreasing combined pitch value. At a fixed perforation ratio, as the size of the holes (e.g., the holes 605, 705) decreases, additional holes may be provided (e.g., drilled) on the surface (e.g., the surface 610, 710) of the back plate (e.g., the back plate 600, 700), thereby increasing the total number of holes on the back plate. Thus, the pitch, p', of FIG. 7 is smaller (e.g., has a smaller value) than the pitch, p, of FIG. 6 and, therefore, the back plate 700 has more holes than the back plate 600. Further, similar to the holes 605, the holes 705 may be arranged in a geometrical or a random pattern so long as the holes are spaced at the same or substantially same combined pitch value.

Figure 8:
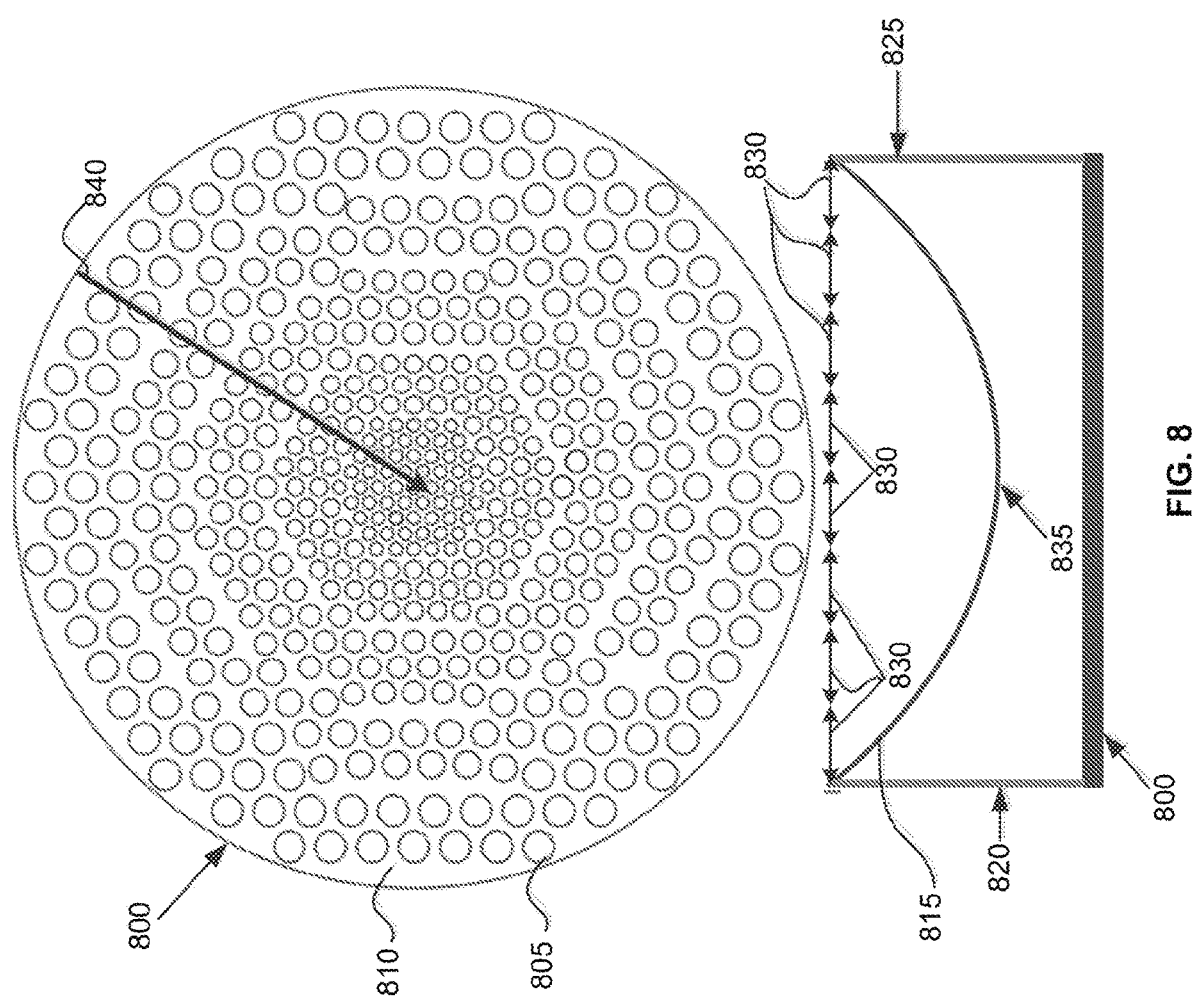
FIG. 8 is an example of the back plate of the acoustic transducer with a non-uniform pattern of holes.

FIG. 8 is an example of a back plate 800 having holes 805 on a surface 810 thereof arranged in a non-uniform pattern. "Non-uniform" as used herein means that the holes 805 are not all equally (or substantially equally) sized and not evenly spaced across the surface 810 of the back plate 800 and, therefore, the combined pitch value between neighboring pairs of holes may vary. Thus, in some embodiments, for a constant AH %, both the size of the holes 805 and the spacing between those holes may vary in a non-uniform pattern. In other embodiments, either the size of the holes 805 or the spacing between those holes may be made to vary by varying the AH % for a non-uniform pattern.

The pattern of the holes 805 depends upon the deflection of diaphragm 815. Since the diaphragm 815 is deflected (e.g., the gap between the diaphragm and the back plate 800 is non-constant or substantially non-constant), the gap between the diaphragm and the back plate varies from one end of the diaphragm to the other. To determine the pattern of the holes 805 on the back plate 800 for the non-constant or substantially non-constant gap, the distance from one end 820 of the diaphragm 815 to another end 825 thereof is vertically divided into a pre-determined number of rings or areas 830. In other embodiments, the number of the areas 830 may be greater or less than the number shown. An average gap value between the diaphragm 815 and the back plate 800 may be associated with each of the areas 830. The average gap values may be input into the computing circuit 205 and stored within the gap profile circuit 235.

For each average gap value, the computing circuit 205 identifies a combined pitch value, as explained above, by computing the plurality of damping parameters and the plurality of capacitance parameters at the average gap value and then determining a combined pitch value from those parameters. Using the combined pitch value of each of the areas 830, the pattern of holes on the surface 810 of the back plate 800 corresponding to that area is determined by the pattern determination circuit 250 of the computing circuit 205. As the combined pitch value varies from one of the areas 830 to another one of the areas, the pattern of the holes 805 also varies on the back plate 800. Since the combined pitch value increases as the gap value increases and since, as the combined pitch value increases, the size of the holes on the back plate increases, the size of the holes 805 on the back plate 800 varies based upon the combined pitch value. The deflection of the diaphragm 815 indicates that the average gap, as shown in FIG. 8, is largest towards the ends 820 and 825 and gradually decreases towards a center 835 of the diaphragm. Thus, the holes 805 have the largest size around a periphery of the back plate 800 and the size of those holes gradually decreases towards a center of the back plate, as shown by arrow 840.

Figure 9:
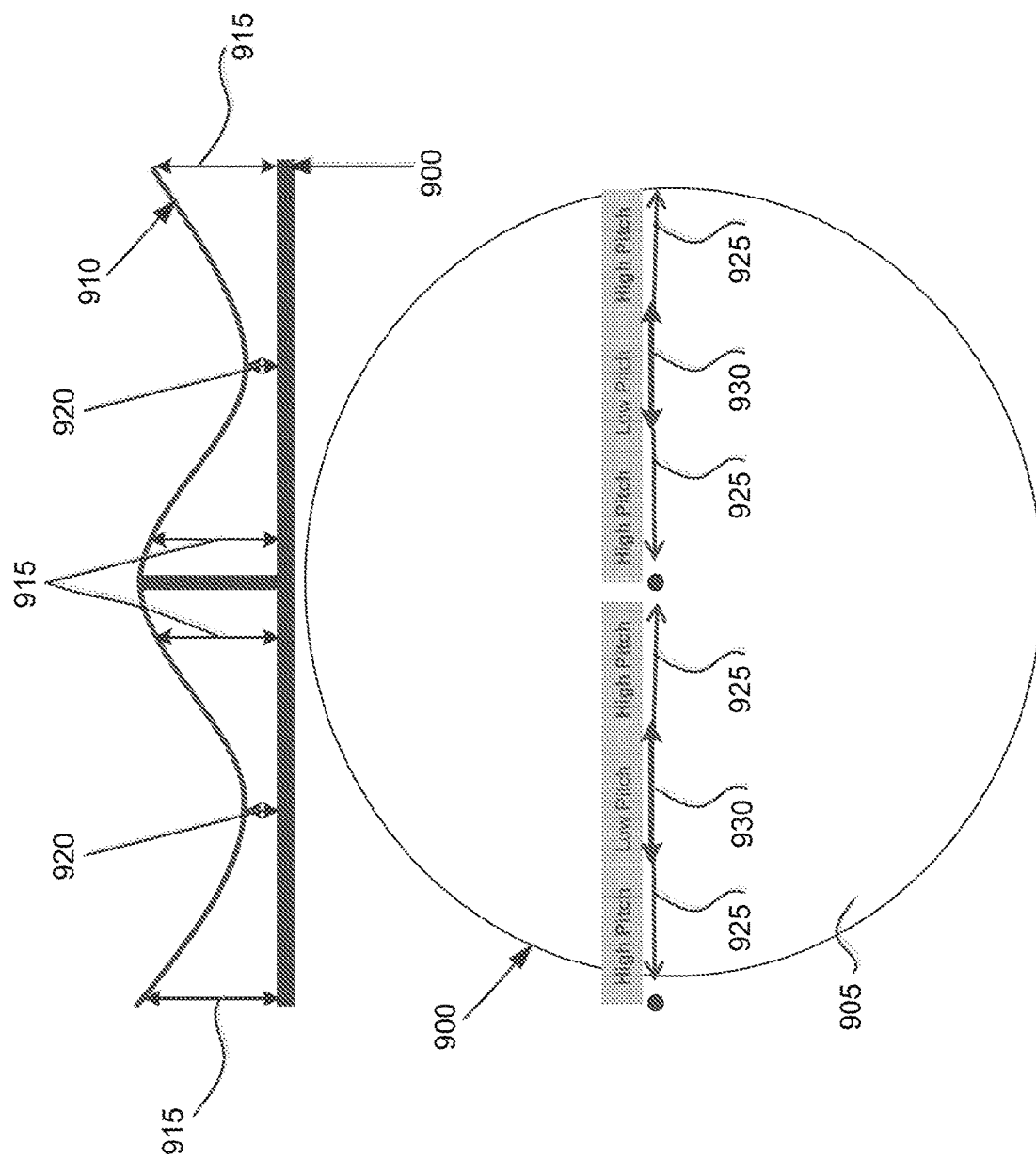
FIG. 9 is an example of the back plate of the acoustic transducer with another non-uniform pattern of holes.

FIG. 9 shows an example of a back plate 900 having a non-uniform pattern of holes. Although the holes are not shown on a surface 905 of the back plate 900, the example shows how the hole pattern varies on the back plate based upon the deflection of diaphragm 910 with respect to the back plate 900. The deflection of the diaphragm 910 shows higher average gap areas 915 and lower average gap areas 920. Thus, the combined pitch value corresponding to the higher average gap areas 915 is higher than the combined pitch value corresponding to the lower average gap areas 920. The variation in the combined pitch value is reflected in the pattern of holes on the surface 905 of the back plate 900, which shows a high pitch area 925 corresponding to the higher average gap areas 915 and a low pitch area 930 corresponding to the lower average gap areas 920. Thus, by being able to determine the combined pitch value for a given average gap value in a non-constant gap configuration, the pattern of holes on the back plate 900 may be determined regardless of the deflection of the diaphragm 910. The number of different combined pitch values that may be determined for the deflection of the diaphragm 910 may vary based upon the number of areas (e.g., the areas 830 in FIG. 8) into which the diaphragm is divided.

FIG. 10 shows a portion of a back plate 1000 having an electrode area 1005 and an outside area 1010 that is outside the electrode area. The electrode area 1005 corresponds to that portion of the back plate 1000 within which motion of a diaphragm 1015 is sensed, and the outside area 1010 corresponds to that portion of the back plate within which the motion produced by the diaphragm is not sensed. In general, a larger sized hole on the back plate 1000 generates lower damping noise than a smaller sized hole. However, a larger sized hole generates a lower quality signal than a smaller sized hole. Specifically, as discussed above, one of the causes of noise attributable to the back plate 1000 is due to vertical air movement through the holes on the back plate. As the hole sizes increase, the capacitance and sensitivity of the back plate 1000 decreases, which in turn negatively impacts the quality of the signal.

On the back plate 1000, signals are generated only within the electrode area 1005 in which the back plate senses motion. Thus, a higher signal quality is desired within the electrode area 1005. In the outside area 1010 where the back plate 1000 does not sense any motion, no signal is generated. Thus, the back plate 1000 may be configured to minimize back plate damping by providing large holes in the outside area 1010 and a pattern of holes based upon a combined pitch value within the electrode area 1005 to keep the quality of signal high and the damping noise low.

In the outside area 1010, since no signal is generated, the holes may be designed to be as large as possible to minimize back plate damping noise attributable to the outside area. Generally speaking, having too few holes in the outside area 1010 is avoided. Thus, the size of the holes in the outside area 1010 may be determined based upon a pitch value selected from a pitch range. For example, in some embodiments, a pitch range of about ten to thirty micrometers may be used. All of the holes on the back plate 1000 in the outside area 1010 may have the same or different size based upon the selected pitch value.

In the electrode area 1005, the gap profile of the diaphragm 1015 may be used to compute a combined pitch value, as discussed above, and the holes on the back plate 1000 within the electrode area may be provided based upon the combined pitch value to minimize damping, while reducing the impact on the quality of the signal.

FIG. 11 is a flowchart outlining operations of a process 1100 for computing a combined pitch value for a given gap value between the back plate (e.g., the back plate 215) and the diaphragm (e.g., the diaphragm 220). After starting at operation 1105, for a given gap value, a plurality of damping parameters, each corresponding to a specific pitch, are computed at operation 1110 by the computing circuit 205. Computation of damping parameters is discussed above with respect to FIGS. 2 and 3A, according to example implementations. Additionally, for the given gap value and the pitches used for computing the plurality of damping parameters, a plurality of capacitance parameters are computed at operation 1115 by the computing circuit 205. Computation of capacitance parameters is discussed above in FIGS. 2 and 3B. At operation 1120, a ratio of each of the plurality of capacitance parameters and its corresponding instance of the plurality of damping parameters is computed to obtain a plurality of ratios by the combined pitch calculator 260 of the computing circuit 205. From the plurality of ratios, at operation 1125, the combined pitch calculator 260 identifies the largest ratio, for example, as shown in FIGS. 4 and 5. One or more pitches corresponding to the largest ratio is identified as the combined pitch value, which is then used to determine a pattern of holes on the back plate by the pattern determination circuit 250 of the computing circuit 205. The process 1100 ends at operation 1130.

Furthermore, the process 1100 may also be used for computing the combined pitch value for a dual back plate configuration. For example, in a dual back plate configuration, a top back plate is provided on the top of a diaphragm and a bottom back plate is provided on the bottom of the diaphragm. To compute a combined pitch value for such a back plate-diaphragm configuration, a first combined pitch value may be computed, as discussed above, for the top back plate and the diaphragm to identify a first pattern of holes for the top back plate. A second combined pitch value may be computed, as discussed above, for the bottom back plate and the diaphragm to identify a second pattern of holes for the bottom back plate. The first combined pitch value may be based upon the gap profile between the top back plate and the diaphragm, and the second combined pitch value may be based upon the gap profile between the bottom back plate and the diaphragm. Thus, the pattern of holes on the top back plate may vary from the pattern of holes on the bottom back plate.

FIG. 12 is a flowchart that outlines operations of a process 1200 for determining a pattern of holes on the back plate (e.g., the back plate 215) by the computing circuit 205. After starting at operation 1205, a gap profile of the diaphragm (e.g., the diaphragm 220) is input into the gap profile circuit 235 of the computing circuit at operation 1210. Other input parameters such as thickness of the back plate and the AH % are also input into the computing circuit 205. Using the gap value(s) in the gap profile, a combined pitch value is computed at operation 1215. If the gap is constant (or substantially constant), then a single combined pitch corresponding to that gap is computed. If the gap is non-constant (or substantially non-constant), then multiple combined pitch values are computed. The combined pitch value(s) are computed using the process 1100 described in FIG. 11 above. At operation 1220, for a constant (or substantially constant) gap, the pattern determination circuit 250 provides a uniform pattern of holes on the back plate based the combined pitch value from the operation 1215. FIGS. 6 and 7 above illustrate examples of a uniform pattern of holes on the back plate. On the other hand, if the gap is non-constant (or substantially non-constant), then at operation 1225, a non-uniform pattern of holes on the back plate is identified by the pattern determination circuit 250 based upon the combined pitch values from the operation 1215. The process 1200 ends at operation 1230.

Figure 13:
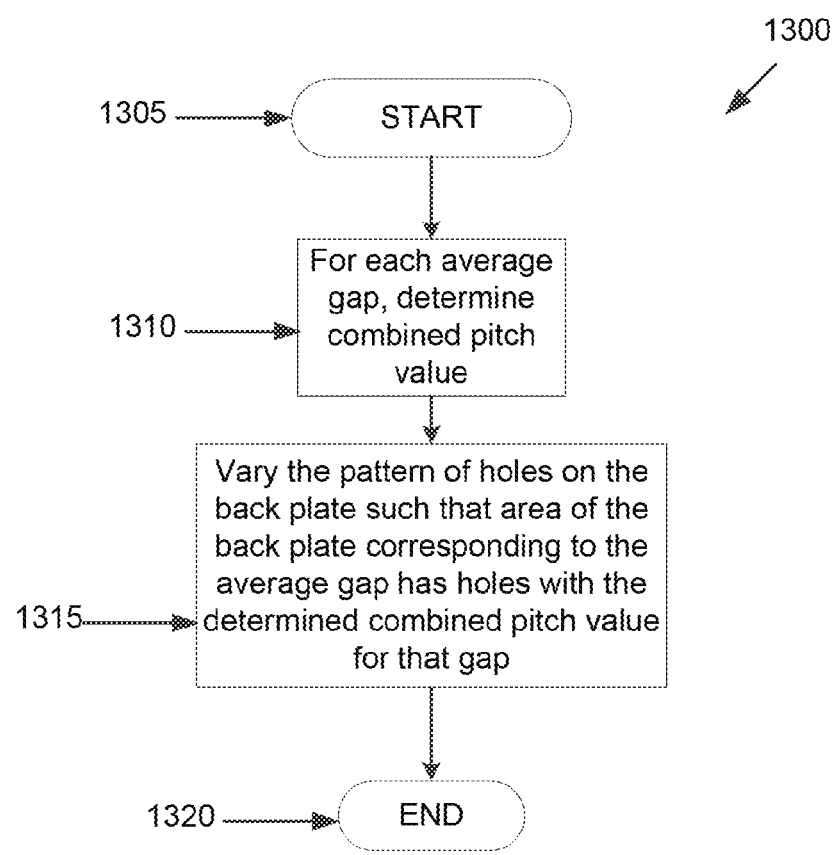
FIG. 13 is a flowchart outlining operations for determining a configuration of the non-uniform pattern of holes on the back plate.

FIG. 13 is a flowchart outlining operations of a process 1300 for identifying a non-uniform pattern of holes for the back plate (e.g., the back plate 215). As discussed above, the non-uniform pattern corresponds to a non-constant or substantially non-constant gap between the back plate and the diaphragm. Further, as indicated above, the gap profile for a non-constant or substantially non-constant gap includes a plurality of gap values that provide average gap values at various measurement points between the back plate and the diaphragm. These average gap values are input into the computing circuit 205. Thus, after starting at operation 1305, at operation 1310 a combined pitch value corresponding to each average gap value is computed using the process 1100. Based upon the combined pitch value, the pattern of the holes on the back plate is varied, at operation 1315, such that areas of the back plate corresponding to each of the average gap values have holes that are sized and spaced based upon the combined pitch value computed for that average gap value. Thus, the back plate has a non-uniform pattern of holes, such as the patterns shown in FIG. 8 or 9. The process 1300 ends at operation 1320.

Figure 14:
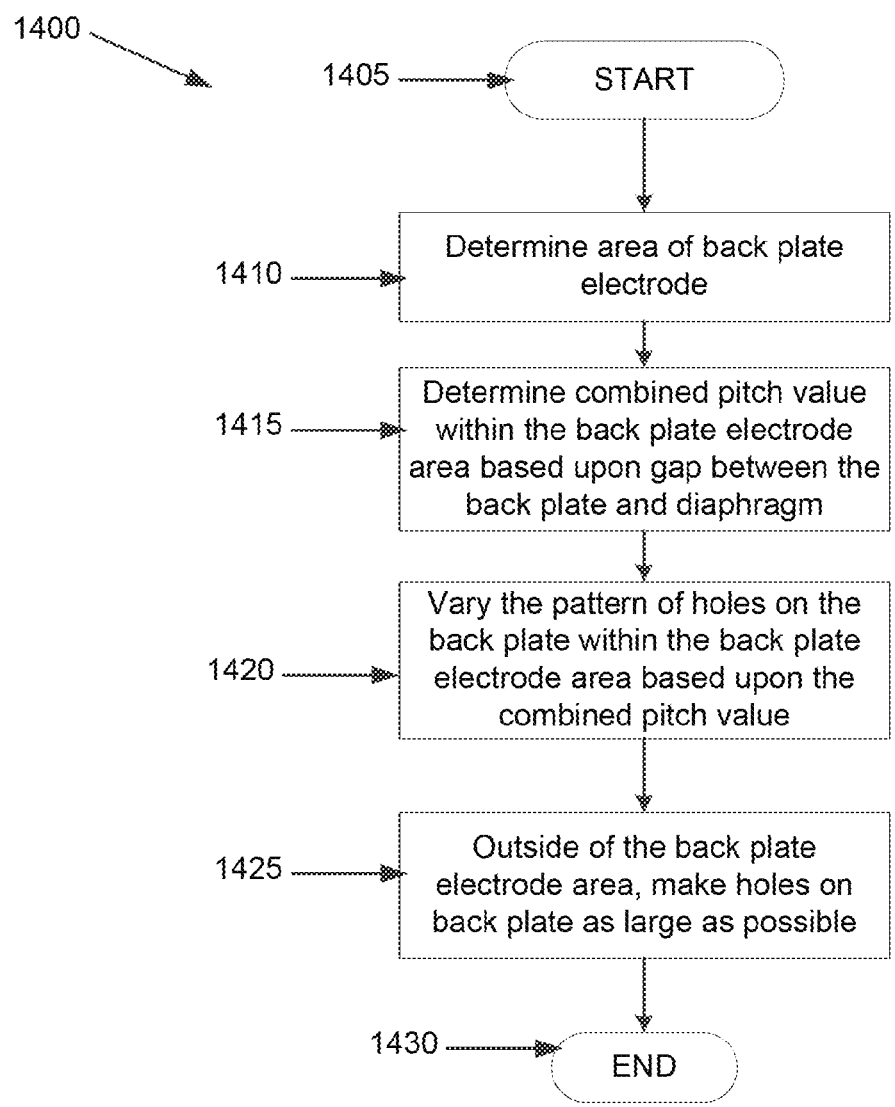
FIG. 14 is a flowchart outlining operations for determining a pattern of holes within the electrode area of the back plate.

FIG. 14 is a flowchart outlining operations of a process 1400 for minimizing damping noise within an electrode area (e.g., the electrode area 1005) of a back plate (e.g., the back plate 1000). After starting at operation 1405, the electrode area is identified at operation 1410. Within the electrode area, one or more combined pitch values are computed based upon a gap between the back plate and its corresponding diaphragm (e.g., the diaphragm 1015) at operation 1415. The gap between the back plate and the diaphragm within the electrode area may be constant (or substantially constant) or non-constant. The combined pitch value(s) are computed using the process 1100 described above. Using the combined pitch value(s), a pattern of holes is determined at operation 1420 for the electrode area. At operation 1425, for an area falling outside of the electrode area (e.g., the outside area 1010), the holes on the back plate are configured to be as large as possible. In some embodiments, a specific number of holes may be desired or needed in the area outside of the electrode area. Thus, the number of holes in the area outside of the electrode area may be provided such that those holes are as large as possible to fit in the specific number of holes that are desired or needed. In some embodiments, a pitch range may be used and the holes in the outside area may be configured to fall within that range. The process ends at operation 1430.

Thus, the system and method described herein advantageously reduces noise that is attributable to the back plate of the acoustic transducer. Since the back plate is the largest contributor of noise in the acoustic transducer, substantial noise reduction may be achieved. By reducing the noise, the signal-to-noise ratio may be increased, and the sound quality of the signal output from the acoustic transducer improved.

In accordance with some aspects of the present disclosure, a microphone assembly is disclosed. The microphone assembly includes an acoustic transducer having a back plate and a diaphragm. A surface of the back plate includes a plurality of holes. At least a portion of the plurality of holes are arranged in a non-uniform pattern that includes holes of varying sizes spaced apart from neighboring holes by varying distances. The microphone assembly also includes an audio signal electrical circuit configured to receive an acoustic signal from the acoustic transducer.

In accordance with other aspects of the present disclosure, a method is disclosed. The method includes calculating, by a computing circuit, a combined pitch value for a gap between a back plate and a diaphragm of an acoustic transducer. The method also includes determining, by the computing circuit, an arrangement of a plurality of holes on a surface of the back plate based upon the combined pitch value, such that at least one of the plurality of holes is increased in size based on a larger combined pitch value. The combined pitch value indicates the distance between centers of two neighboring holes of the plurality of holes.

In accordance with yet other aspects of the present disclosure, a method is disclosed. The method includes computing, by the computing circuit, a plurality of damping parameters for a gap between a back plate and a diaphragm of an acoustic transducer, such that each of the plurality of damping parameters is computed using a different value of pitch. The method also includes measuring, by the computing circuit, a plurality of capacitance parameters for the gap, such that each of the plurality of capacitance parameters is computed using the different value of the pitch. The method further includes computing, by the computing circuit, a ratio of each of the plurality of capacitance parameters and a corresponding one of the plurality of damping parameters, determining, by the computing circuit, a largest ratio from the computed ratios, identifying, by the computing circuit, a combined pitch value corresponding to a range of ratios adjacent to the largest ratio, and determining, by the computing circuit, an arrangement of a plurality of holes on a surface of the back plate based upon the combined pitch value. The arrangement is a uniform pattern if the gap is substantially constant and the arrangement is a non-uniform pattern if the gap is non-constant.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents. While various embodiments and figures are described as including particular components, it should be understood that modifications to the embodiments described herein can be made without departing from the scope of the present disclosure. For example, in various implementations, an embodiment described as including a single component could include multiple components in place of the single component, or multiple components could be replaced with a single component. Similarly, embodiments described as including a particular component may be modified to replace that component with an alternative component or group of components designed to perform a similar function. In some embodiments, method steps described herein could be performed in a different order, additional steps than are shown may be performed, or one or more steps may be omitted.

The invention claimed is:

1. A microphone assembly comprising:
an acoustic transducer having a back plate and a diaphragm, wherein a surface of the back plate comprises a plurality of holes, wherein at least a portion of the plurality of holes are arranged in a non-uniform pattern, wherein the non-uniform pattern comprises holes of varying sizes that are spaced apart from a periphery of neighboring holes by varying distances, and wherein the non-uniform pattern is determined based upon a combined pitch value that identifies a distance from a center of one of the plurality of holes to the center of one of the neighboring holes; and
an audio signal electrical circuit configured to receive an acoustic signal from the acoustic transducer.

2. The microphone assembly of claim 1, wherein at least one of the plurality of holes near a perimeter of the back plate is larger than at least one of the plurality of holes near a center of the back plate.

3. The microphone assembly of claim 2, wherein spacing between the neighboring holes is larger near the perimeter of the back plate than near the center of the back plate.

4. The microphone assembly of claim 1, wherein at least one of the plurality of holes near an outer perimeter of the back plate and at least one of the plurality of holes near a center of the back plate are larger than at least one of the plurality of holes in between the outer perimeter and the center.

5. The microphone assembly of claim 1, wherein a portion of the surface of the back plate comprises an electrode area, and wherein at least one hole outside the electrode area is larger than at least one hole within the electrode area.

6. The microphone assembly of claim 5, wherein the portion of the plurality of holes that are arranged in the non-uniform pattern are within the electrode area, and wherein a remaining portion of the plurality of holes are outside the electrode area and arranged in a uniform pattern in which holes are equal in size and spaced apart equally from neighboring holes.

7. The microphone assembly of claim 1, wherein the combined pitch value is between six micrometers and thirty seven micrometers.

8. The microphone assembly of claim 1, wherein the combined pitch value is between twenty and twenty four micrometers.

9. The microphone assembly of claim 1, wherein a gap between the back plate and the diaphragm is between one half of a micrometer and ten micrometers.

10. The microphone assembly of claim 1, wherein a thickness of the back plate is between one tenth of a micrometer and six micrometers.

11. The microphone assembly of claim 1, wherein a perforation ratio is between twenty five percent and eighty percent.

12. The microphone assembly of claim 1, wherein the combined pitch value is between nine micrometers and thirteen micrometers.

13. The microphone assembly of claim 1, wherein the combined pitch value is between thirty three micrometers and thirty seven micrometers.

14. A method comprising:
calculating, by a computing circuit, a combined pitch value for a gap between a back plate and a diaphragm of an acoustic transducer; and
determining, by the computing circuit, an arrangement of a plurality of holes on a surface of the back plate based upon the combined pitch value, such that at least one of the plurality of holes is increased in size based on a larger combined pitch value, wherein the combined pitch value indicates a distance between centers of two neighboring holes of the plurality of holes.

15. The method of claim 14, wherein calculating, by the computing circuit, the combined pitch value comprises:
calculating a plurality of damping parameters of the back plate for the gap;
measuring a plurality of capacitance parameters between the back plate and the diaphragm for the gap;
computing a ratio of each of the plurality of capacitance parameters and the corresponding plurality of damping parameters;
determining a largest ratio from the computed ratios; and
assigning a pitch value corresponding to a range of ratios around the largest ratio as the combined pitch value.

16. The method of claim 14, wherein the arrangement comprises a plurality of equally sized holes evenly spaced on the surface of the back plate when the gap between the diaphragm and the back plate is constant.

17. The method of claim 14, wherein when the gap between the diaphragm and the back plate is non-constant, determining, by the computing circuit, the arrangement comprises:
dividing the diaphragm into a plurality of areas, each of the plurality of areas having an average gap value associated therewith;
computing the combined pitch value corresponding to each of the average gap value; and
varying the arrangement of the plurality of holes on the back plate such that each of the plurality of areas on the back plate comprises holes corresponding to the combined pitch value computed for that one of the plurality of areas.

18. The method of claim 14, further comprising:
determining, by the computing circuit, an area of the back plate having an electrode; and
determining, by the computing circuit, the arrangement of the plurality of holes within the area.

19. A method comprising:
computing, by a computing circuit, a plurality of damping parameters for a gap between a back plate and a diaphragm of an acoustic transducer, wherein each of the plurality of damping parameters is computed using a different value of pitch;
measuring, by the computing circuit, a plurality of capacitance parameters for the gap, wherein each of the plurality of capacitance parameters is computed using the different value of the pitch;
computing, by the computing circuit, a ratio of each of the plurality of capacitance parameters and a corresponding one of the plurality of damping parameters;
determining, by the computing circuit, a largest ratio from the computed ratios; identifying, by the computing circuit, a combined pitch value corresponding to a range of ratios around the largest ratio; and
determining, by the computing circuit, an arrangement of a plurality of holes on a surface of the back plate based upon the combined pitch value, wherein the arrangement is a uniform pattern if the gap is constant and the arrangement is a non-uniform pattern if the gap is non-constant.

20. The method of claim 19, wherein a size of at least one of the plurality of holes increases as the combined pitch value increases.

21. The method of claim 19, wherein the combined pitch value is calculated at a constant acoustic hole percentage.

22. The method of claim 19, wherein the uniform pattern includes equally sized holes evenly spaced on the back plate.

23. The method of claim 19, wherein the non-uniform pattern includes areas of different sized holes on the back plate, the size of the holes in the areas based upon the combined pitch value in the areas.

* * * * *